United States Patent

[11] 3,571,740

[72] Inventor Nikolai Goncharoff
Roselle, Ill.

[21] Appl. No. 768,121
[22] Filed Oct. 16, 1968
[45] Patented Mar. 23, 1971
[73] Assignee Motorola Inc.
Franklin Park, Ill.

[54] INDUCTORLESS IF AMPLIFIER AND FILTER CIRCUIT
3 Claims, 2 Drawing Figs.

[52] U.S. Cl. .......... 330/28, 330/31, 330/38, 331/110, 333/75
[51] Int. Cl. .......... H03f 1/34
[50] Field of Search .......... 330/28, 31, 38; 331/110, 142; 333/70, 75

[56] References Cited
OTHER REFERENCES
I.F. Barditch, ELECTRONIC DESIGN, Feb. 17, 1964, Pgs. 44— 51
K.G. Beauchamp, ELECTRONIC ENGINEERING, June 1967, pgs. 384— 387

*Primary Examiner*—John Kominski
*Attorney*—Mueller & Aichele

ABSTRACT: An IF amplifier circuit for a radio receiver includes a tuned feedback circuit to provide the desired frequency response for the IF amplifier. The tuned feedback circuit includes a twin T filter and is connected to the input and output of the IF amplifier through isolation networks. No inductors are required in this circuit so that it can be manufactured in an integrated circuit form. Provision is made for the connection of external resistors to the twin T filter in order to tune the integrated circuit to give the proper IF frequency response.

PATENTED MAR 23 1971

3,571,740

Inventor
NIKOLAI GONCHAROFF
BY Mueller, Aichele and Rauner
ATTYS.

INDUCTORLESS IF AMPLIFIER AND FILTER CIRCUIT

BACKGROUND OF THE INVENTION

In present day radio sets integrated circuits are being used to replace conventional components in order to reduce the size and number of components in the radios. However, in the present state of the art it is not practical to form inductors in an integrated circuit so that tuned circuits using inductors are difficult to replace with an integrated circuit.

One circuit which must be frequency selective is the IF amplifier stage of a receiver. The conventional method of achieving the desired frequency response is to couple one or more tuned circuits in series with the amplifying stages of the IF amplifier. Another less conventional method is to use a negative feedback loop incorporating a frequency responsive circuit which has a null at the desired frequency response of the IF amplifier. The negative feedback loop thus provides negative feedback at all frequencies except the frequency to which the IF amplifier is tuned. While prior art circuits have been built using a frequency selective negative feedback circuit these circuits have not worked well at higher frequencies as the feedback loop loads the amplifying stages of the amplifier stage. A further problem exists if the feedback loop is in an integrated circuit form as it is difficult to manufacture an integrated negative feedback loop having a null at the exact desired frequency.

SUMMARY

It is, therefore, an object of this invention to provide an improved intermediate frequency amplifier circuit which does not require the use of inductors.

Another object of this invention is to provide an intermediate frequency amplifier for a radio receiver which can be manufactured in integrated circuit form and which can be tuned to the desired frequency.

In practicing this invention an amplifier is provided having a negative feedback loop connected between the output and the input of the amplifier. The negative feedback loop contains a twin T null filter so that negative feedback is not provided at the frequency to which the IF amplifier is tuned. Isolating networks are provided connecting the twin T filter network to the input and output of the intermediate frequency amplifier to prevent loading of the amplifier. The negative feedback loop can be manufactured in an integrated circuit form and includes external terminals to which tuning resistors can be connected to adjust the frequency of the twin T network as desired.

Figure 1:
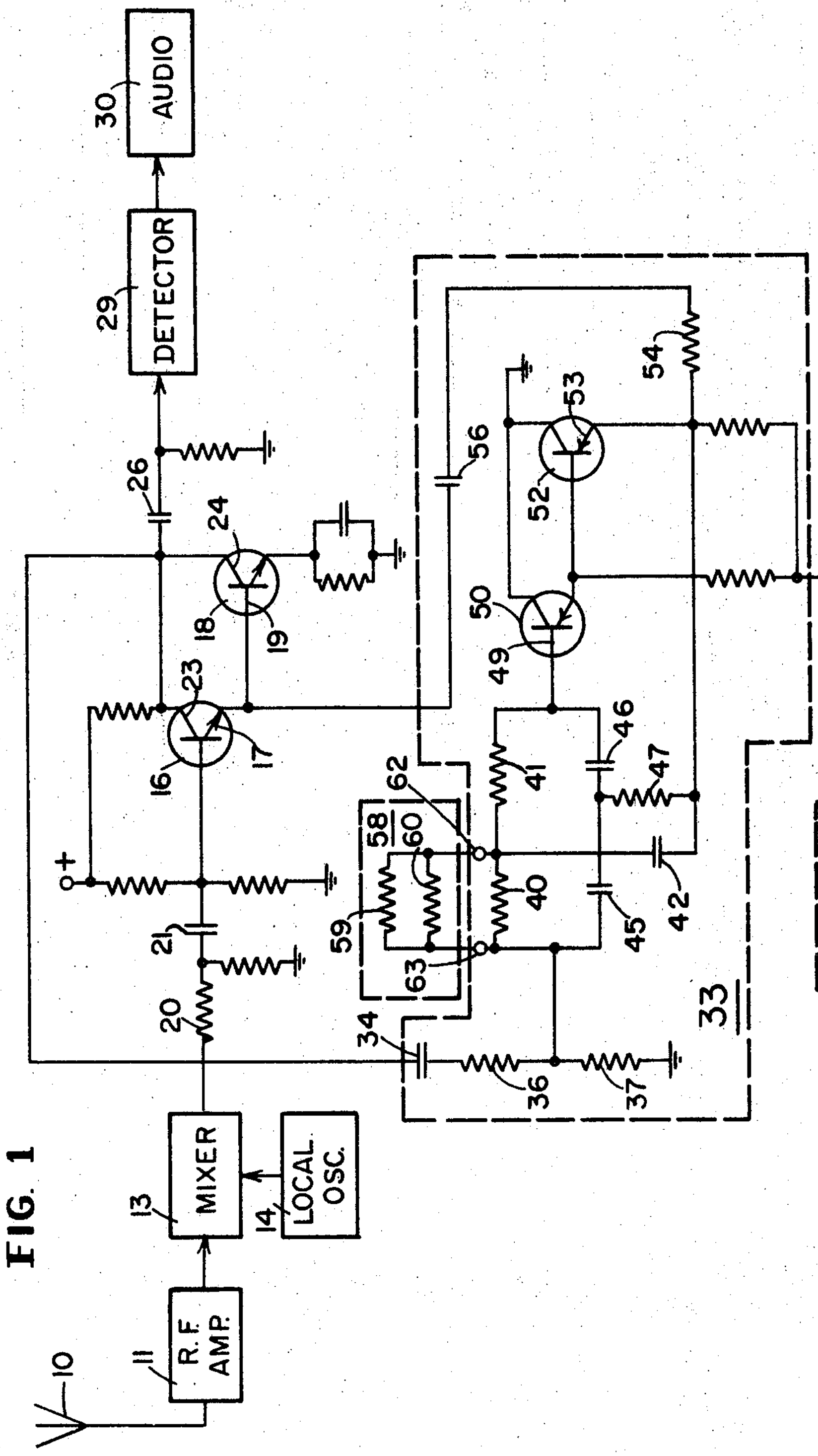
Figure 2:
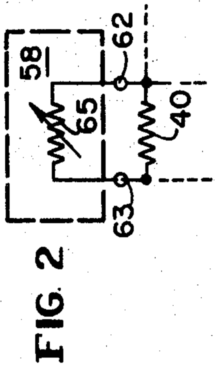

The invention is illustrated in the drawings of which: FIG. 1 is a partial schematic and partial block diagram of a radio receiver showing the intermediate frequency amplifier stage of this invention; and FIG. 2 is a schematic of a portion of the feedback loop of FIG. 1 illustrating the method of tuning of the twin T network.

DESCRIPTION OF THE INVENTION

In FIG. 1 a radio receiver circuit is shown in partial schematic and partial block diagram form. Signals received by antenna 10 are amplified in RF amplifier 11 and converted to an intermediate frequency signal by mixing in mixer 13 with a signal from local oscillator 14. The intermediate frequency signal from mixer 13 is coupled through resistor 20, capacitor 21 to IF amplifier transistors 16 and 18. The output of transistor amplifiers 16 and 18 is coupled from collectors 23 and 24 of transistors 16 and 18 respectively through capacitor 26 to the detector 29. The output of detector 29 is coupled to audio stage 30 for reproduction thereby.

In order to provide proper operation of the receiver the intermediate frequency amplifier should be responsive only to signals of a particular desired frequency. In order to provide the frequency selectivity required, a negative feedback circuit 33 is incorporated. Output signals from collectors 23 and 24 of transistors 16 and 18 respectively are coupled to a twin T filter network through capacitor 34 and resistor 36.

The twin T filter network consists of two sections. One section consists of a resistive branch with resistors 40 and 41 connected in series and a capacitor 42. The second section consists of a capacitive branch with capacitors 45 and 46 connected in series and a resistor 47. The output of the twin T filter network is connected to base 49 of transistor 50. Transistors 50 and 52 form a darlington pair to amplify the feedback signal to the desired level. The output of the feedback amplifier is coupled from emitter 53 of transistor 52 through resistor 54 and capacitor 56 to base 19 of transistor 18.

Signals outside of the desired frequency band of the IF amplifier are coupled through the twin T filter network to the feedback amplifiers and are applied to the input of the IF amplifier with phase reversal to provide cancellation. The signals in the desired frequency band are attenuated by the twin T network and are not available for cancellation. Thus the feedback network acts to limit the frequency response of the IF amplifier to a desired frequency.

Capacitor 34 and the voltage divider consisting of resistors 36 and 37 provide isolation between the output of the IF amplifier and the twin T filter network to prevent loading of the output by the twin T filter network. The darlington amplifier consisting of transistors 50 and 52 provides isolation between the twin T filter network and the input of the IF amplifier. By providing this isolation the tuning of the twin T filter incorporated in the feedback circuit can be carried out without affecting the IF amplifier.

The feedback circuit 33 enclosed in the dashed lines can be formed as an integrated circuit network. However, when this is done it is difficult to control the frequency response of the negative feedback circuit and, therefore, the frequency response of the IF amplifier. In order to provide means for tuning the twin T filter network, a pair of terminals 62 and 63 connected at opposite ends of resistor 40 are provided. A tuning circuit consisting of resistors 59 and 60 is connected to the external terminals 62 and 63 and in parallel with resistor 40. By this means the effective resistance of resistor 40 can be changed to provide tuning of the twin T filter network. In FIG. 1 two resistors are shown of which one could be used for coarse tuning and the second for fine tuning the circuit. However, tuning could also be carried out using a single resistor of the correct value.

An alternate method of tuning the twin T filter network is shown in FIG. 2 where the tuning network 58 includes a variable resistor 65 connected across external terminals 62 and 63. The value of variable resistor 65 can be changed until the desired frequency response of the twin T filter network is obtained.

Thus an IF circuit suitable for construction in integrated circuit form has been shown. The circuit has no inductors and provides means for changing the frequency response of the circuit.

I claim:

1. In a radio receiver having first circuit means for receiving and translating signals and second circuit means, intermediate frequency amplifier circuit means coupling said first circuit means to said second circuit means, said intermediate frequency amplifier circuit means including in combination, amplifier means having input circuit means coupled to the first circuit means and output circuit means coupled to the second circuit means, feedback circuit means in the form of an integrated circuit and having a plurality of external terminals, said feedback circuit means including symmetrical twin T filter circuit means, isolation circuit means coupling said output circuit means to said symmetrical twin T circuit means, and feedback amplifier means coupling said symmetrical twin T circuit means to said input circuit means, said symmetrical twin T filter circuit means including a branch having first and second resistors connected in series with said first resistor having a first terminal connected to one of said external terminals and a second terminal connected to another of said external terminals, and tuning resistor means including at least one resistor connected between said one and said other of said external terminals and in parallel with said first resistor for establishing the resonant frequency of said symmetrical twin T circuit means at a desired value.

2. The intermediate frequency amplifier circuit means of claim 1 wherein, said tuning resistor means includes a variable resistor connected between said one and said other of said external terminals and in parallel with said first resistor.

3. The intermediate frequency amplifier circuit means of claim 1 wherein, said tuning resistor means includes third and fourth resistors connected in parallel between said one and said other of said external terminals, the value of said third resistor being chosen to provide coarse tuning of said twin T filter circuit means and the value of said fourth resistor being chosen to provide fine tuning of said twin T filter circuit means.